US012614766B2

(12) United States Patent
Kondo

(10) Patent No.: US 12,614,766 B2
(45) Date of Patent: Apr. 28, 2026

(54) BATTERY BACKUP CAPACITY DETECTION

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 608 days.

(21) Appl. No.: 18/146,504

(22) Filed: Dec. 27, 2022

(65) Prior Publication Data

US 2024/0213554 A1 Jun. 27, 2024

(51) Int. Cl.
H01M 10/42 (2006.01)
G01R 31/382 (2019.01)
G01R 31/389 (2019.01)
G01R 31/392 (2019.01)

(52) U.S. Cl.
CPC ...... H01M 10/4285 (2013.01); G01R 31/382 (2019.01); G01R 31/389 (2019.01); G01R 31/392 (2019.01)

(58) Field of Classification Search
CPC .. G01R 31/382; G01R 31/389; G01R 31/392; G01R 3/00; G01R 1/30; G01R 1/38; G01R 31/3865; G01R 31/3648; G01R 31/367; G01R 31/3842; G01R 31/387; G01R 31/396; H01M 10/4285; H01M 10/0525; H01M 10/44; H01M 10/48
See application file for complete search history.

(56) References Cited

U.S. PATENT DOCUMENTS

| | | | |
|---|---|---|---|
| 2013/0322488 A1* | 12/2013 | Yazami | H01M 10/486 374/100 |
| 2017/0219660 A1 | 8/2017 | Christensen et al. | |
| 2019/0113577 A1 | 4/2019 | Severson et al. | |
| 2019/0288520 A1 | 9/2019 | Abdel-Monem et al. | |

* cited by examiner

*Primary Examiner* — Catherine T. Rastovski
*Assistant Examiner* — Brian Butler Geiss
(74) *Attorney, Agent, or Firm* — Polansky & Associates, P.L.L.C.; Paul J. Polansky; Nathan H. Calvert

(57) ABSTRACT

A method, system, and integrated circuit are provided for monitoring a battery capacity within a battery backup system. A battery degradation profile is provided for a battery including first data associating operating temperature over accumulated time with second battery degradation data. The battery is kept charged in a failover battery backup circuit. The operating temperature of the battery is measured over time and third data is stored for the operating temperature over accumulated time. While the battery is operated in the backup system, the battery degradation profile is accessed based on the third data to obtain an associated battery degradation estimate. Responsive to the battery degradation estimate meeting a designated condition, the battery is electronically switched from operation to a test circuit, and the internal impedance of the battery is measured. Responsive to an unacceptable value of the internal impedance, an alert is issued.

20 Claims, 8 Drawing Sheets

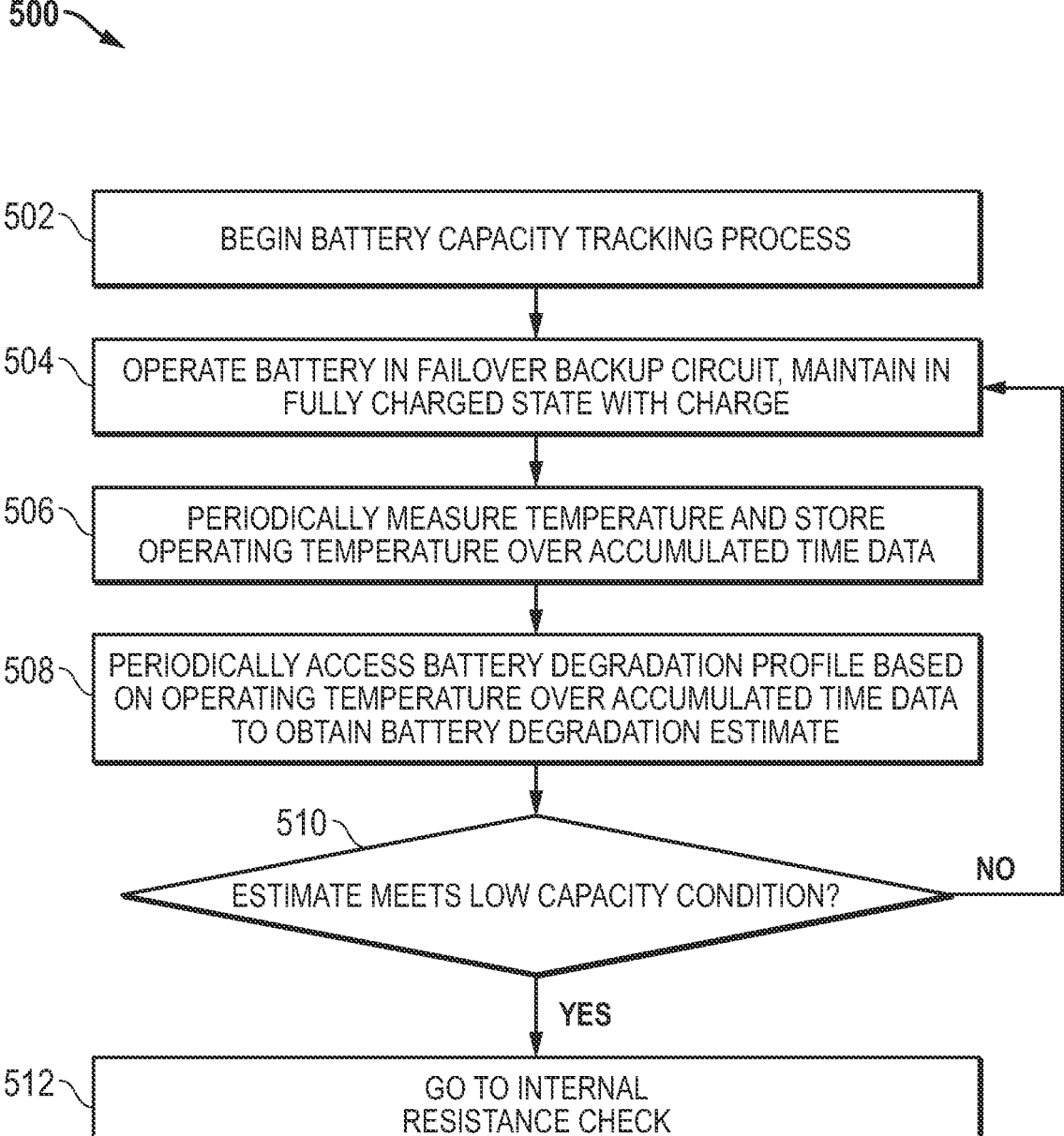

500

502 — BEGIN BATTERY CAPACITY TRACKING PROCESS

504 — OPERATE BATTERY IN FAILOVER BACKUP CIRCUIT, MAINTAIN IN FULLY CHARGED STATE WITH CHARGE

506 — PERIODICALLY MEASURE TEMPERATURE AND STORE OPERATING TEMPERATURE OVER ACCUMULATED TIME DATA

508 — PERIODICALLY ACCESS BATTERY DEGRADATION PROFILE BASED ON OPERATING TEMPERATURE OVER ACCUMULATED TIME DATA TO OBTAIN BATTERY DEGRADATION ESTIMATE

510 — ESTIMATE MEETS LOW CAPACITY CONDITION?

NO

YES

512 — GO TO INTERNAL RESISTANCE CHECK

Figure 6:
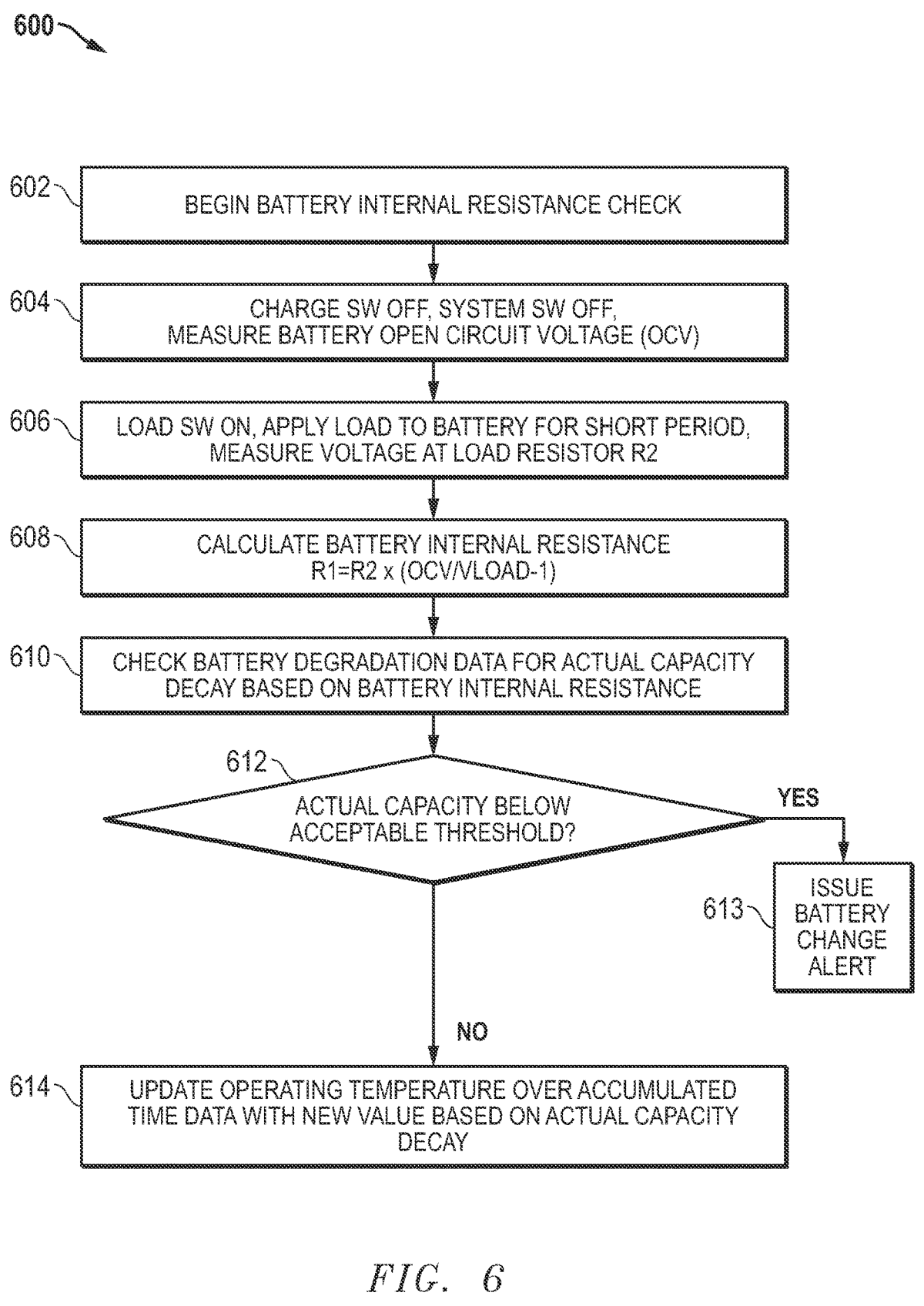

602 — BEGIN BATTERY INTERNAL RESISTANCE CHECK

604 — CHARGE SW OFF, SYSTEM SW OFF,
MEASURE BATTERY OPEN CIRCUIT VOLTAGE (OCV)

606 — LOAD SW ON, APPLY LOAD TO BATTERY FOR SHORT PERIOD,
MEASURE VOLTAGE AT LOAD RESISTOR R2

608 — CALCULATE BATTERY INTERNAL RESISTANCE
R1=R2 x (OCV/VLOAD-1)

610 — CHECK BATTERY DEGRADATION DATA FOR ACTUAL CAPACITY
DECAY BASED ON BATTERY INTERNAL RESISTANCE

612 — ACTUAL CAPACITY BELOW
ACCEPTABLE THRESHOLD?

YES

613 — ISSUE
BATTERY
CHANGE
ALERT

NO

614 — UPDATE OPERATING TEMPERATURE OVER ACCUMULATED
TIME DATA WITH NEW VALUE BASED ON ACTUAL CAPACITY
DECAY

"Temperature history with time (month) for condition changing"

800

| Month | case-1 | case-2 | case-3 |
|---|---|---|---|
| 0 | 20.0 | 40.0 | 60.0 |
| 1 | 60.0 | 42.0 | 62.0 |
| 2 | 60.0 | 38.0 | 58.0 |
| 3 | 60.0 | 42.0 | 62.0 |
| 4 | 60.0 | 38.0 | 58.0 |
| 5 | 30.0 | 42.0 | 62.0 |
| 6 | 22.0 | 42.0 | 62.0 |
| 7 | 32.0 | 38.0 | 58.0 |
| 8 | 22.0 | 42.0 | 62.0 |
| 9 | 18.0 | 38.0 | 58.0 |
| 10 | 60.0 | 42.0 | 62.0 |
| 11 | 60.0 | 40.0 | 60.0 |
| 12 | 21.0 | 41.0 | 61.0 |
| Temperature accumulation [temp x time] | 444.0 | 444.0 | 664.0 |

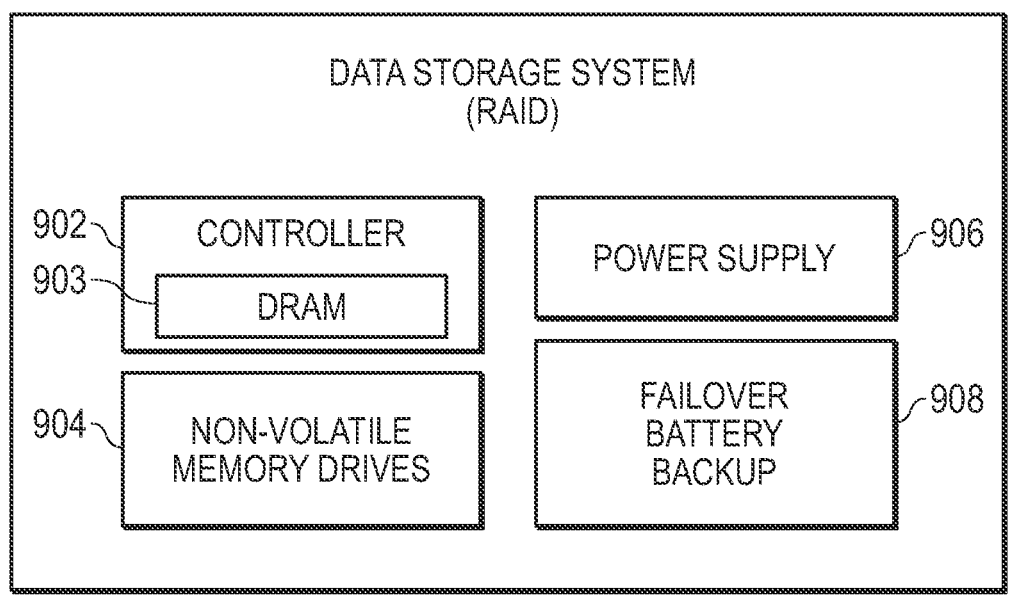
*FIG. 9*

BATTERY BACKUP CAPACITY DETECTION

FIELD OF THE INVENTION

The disclosure relates to techniques for monitoring of batteries in battery backup systems, as well as systems and integrated circuits performing such monitoring.

BACKGROUND

For battery-powered devices that use lithium-ion batteries, such as medical devices, portable devices, industrial devices, and electric vehicles, it is a strong requirement that hazardous conditions within the lithium-ion battery be detected in advance. While various failure conditions can exist within such batteries, battery aging and the associated increase in internal resistance are an important cause of failure conditions. Further, batteries with manufacturing flaws have a greater tendency for failures, which increases more quickly over time than for normal batteries.

Prior art battery techniques for monitoring capacity in a backup battery tend to focus on taking frequent measurements of the battery to check capacity. However, such approaches present problems in the context of failover battery backup systems, because the battery backup system needs to be consistently available. Because typical battery tests involve at least a partial discharge cycle, they tend to take a relatively long time, e.g., on the order of hours, and therefore make the battery backup system unavailable during that time. Should a power failure occur during a battery test, the battery backup system is not available and the general purpose of the backup system is not met.

BRIEF DESCRIPTION OF THE DRAWINGS

The present disclosure may be better understood, and its numerous features and advantages made apparent to those skilled in the art by referencing the accompanying drawings, in which:

FIG. 5 shows a flowchart of a process for tracking a battery capacity according to some embodiments;

FIG. 6 shows a flowchart of a process for performing an internal resistance check of a battery according to some embodiments;

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1A:
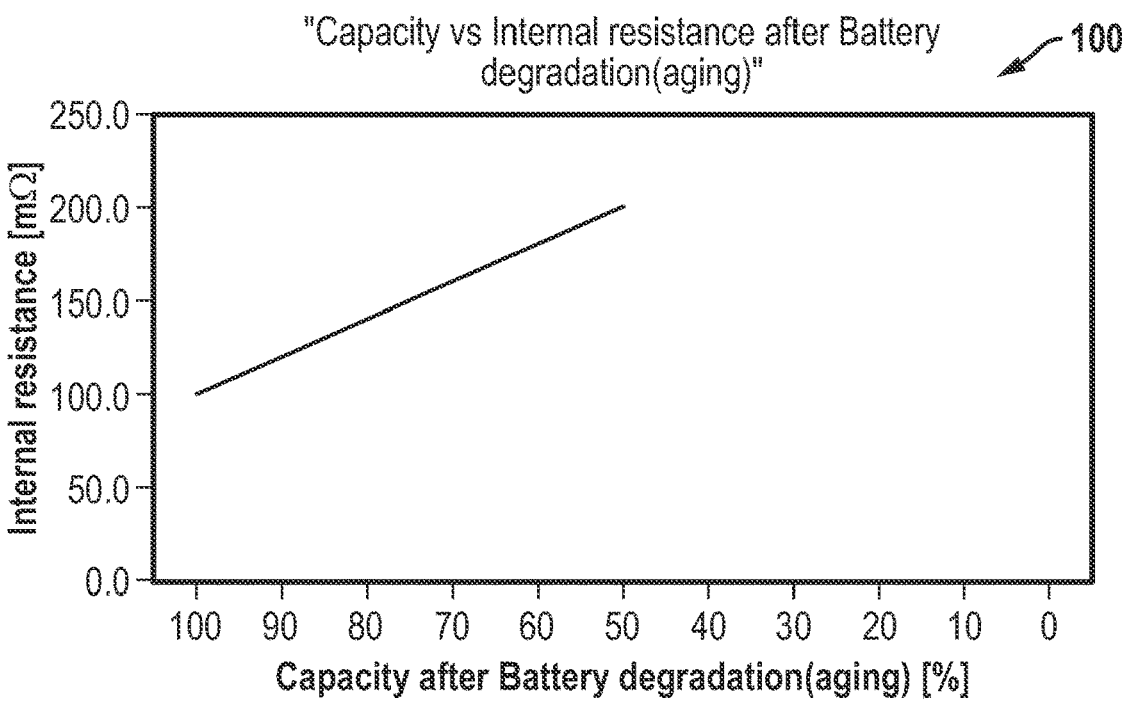
FIG. 1A shows a graph of battery capacity versus the internal resistance of a battery as the battery ages.

FIG. 1A shows a graph of battery capacity versus the internal resistance of a battery as the battery ages. Graph 100 depicts the capacity versus the internal resistance of a battery, with the internal resistance shown in the vertical axis in milli-ohms and the capacity shown on the horizontal axis as a percentage of a new full capacity battery. The particular values are illustrative and will vary depending on the battery type. As can be seen, a new battery at 100% has an internal resistance of about 100 milli-ohms, which increases to about 200 milli-ohms as the battery ages and degrades in capacity to about 50% of the original capacity.

Figure 1B:
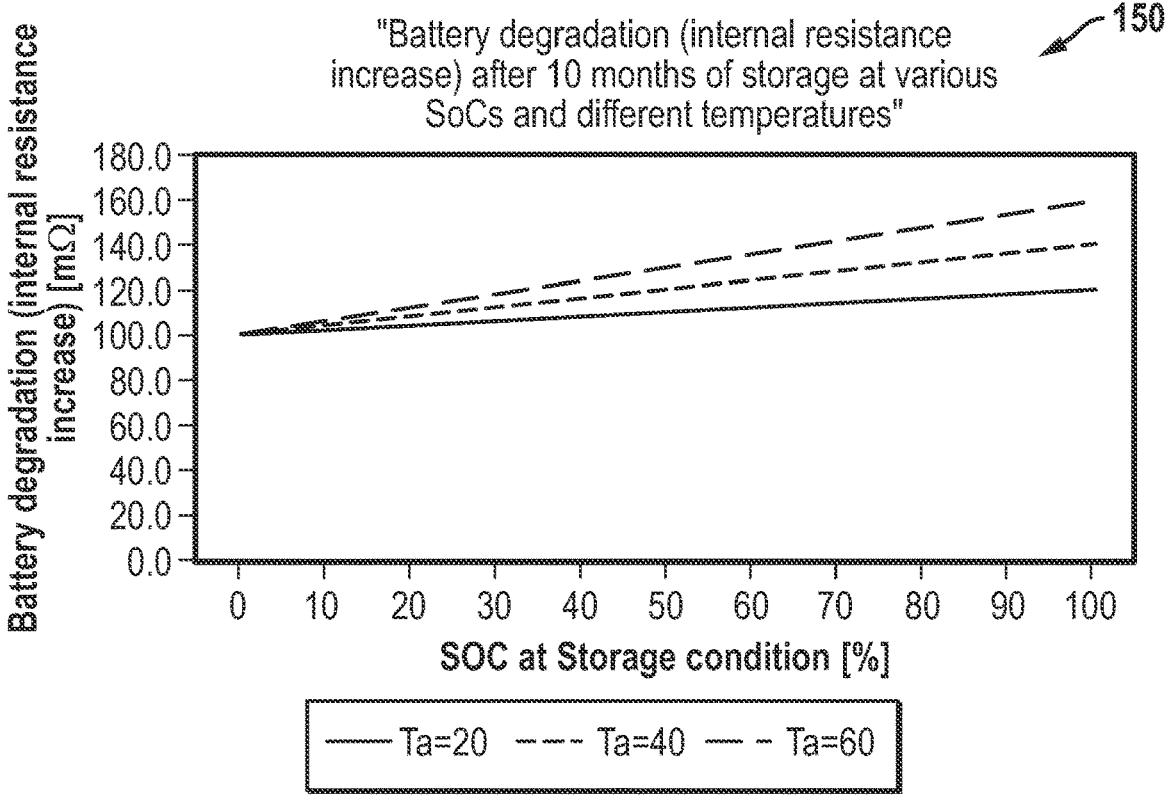
FIG. 1B shows a graph of battery capacity versus the internal resistance of a battery over time at various temperatures.

FIG. 1B shows a graph of battery state of charge versus the internal resistance of a battery over time at various temperatures. Graph 150 depicts the degradation of a battery at various states of charge (SOC) and multiple temperatures versus the internal resistance of the battery. The internal resistance shown in the vertical axis in milli-ohms and the SOC shown on the horizontal axis as a percentage of the full capacity. The particular values are, again, illustrative. Depicted are three plots illustrating degradation (internal resistance increase) after 10 months of storage at temperatures of 20° C., 40° C., and 60° C. Generally, storage at lower temperatures can be seen to cause less degradation. Further, storage at a low SOC causes less degradation than storage at a higher SOC. This has implications for use in failover battery backup systems, since a battery should be maintained at or near the 100% state of charge to be available.

Figure 2A:
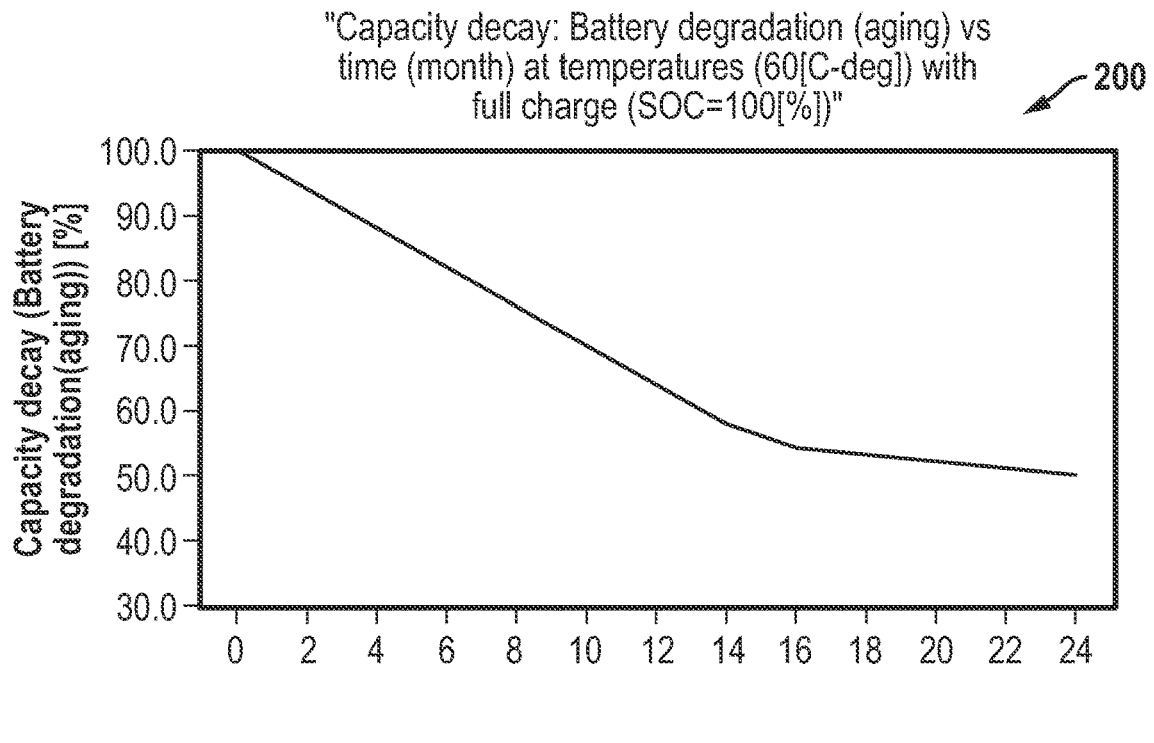
FIG. 2A shows a graph illustrating how a battery loses capacity over time.

FIG. 2A shows a graph illustrating how a battery loses capacity over time. Graph 200 depicts the capacity decay due to battery degradation over time with storage at 60° C. with a full charge. The vertical axis shows battery capacity as a percentage of the original full capacity, and the horizontal axis shows storage time in months. As can be seen, the capacity degrades significantly over the first 16 months to around 54%, and then the degradation slows slightly but continues until the battery reaches 50% capacity at around 24 months. It is noted that these conditions reflect conditions for a battery in a failover battery backup system at such a temperature, in which the battery charge is maintained with maintenance charging over time.

Figure 2B:
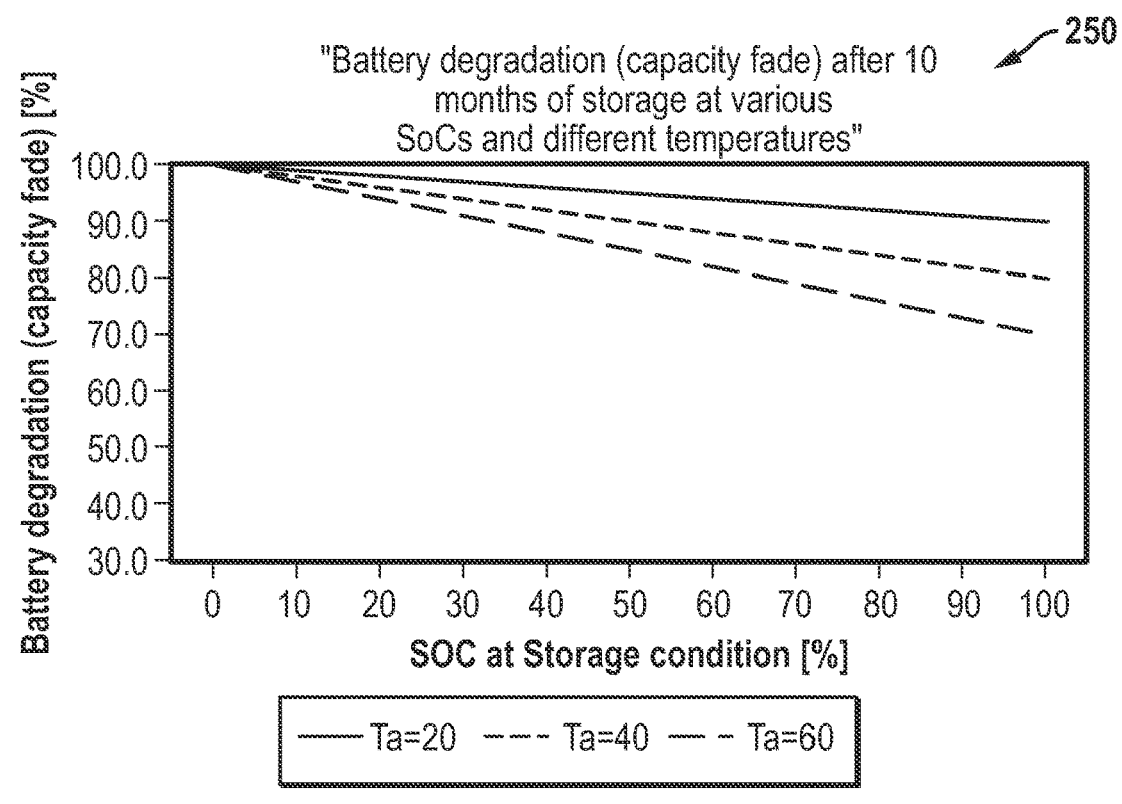
FIG. 2B illustrates in diagram form how a battery loses capacity over time.

FIG. 2B illustrates in graph form how a battery loses capacity over time. Graph 250 depicts the capacity decay due to battery degradation versus SOC with storage at temperatures of 20° C., 40° C., and 60° C. The vertical axis shows battery capacity as a percentage of the original full capacity, and the horizontal axis shows SOC at the storage condition. As can be seen, storage at higher SOC's causes increased battery degradation. Storage at higher temperatures also causes increased battery degradation.

Figures 3A, 3B:
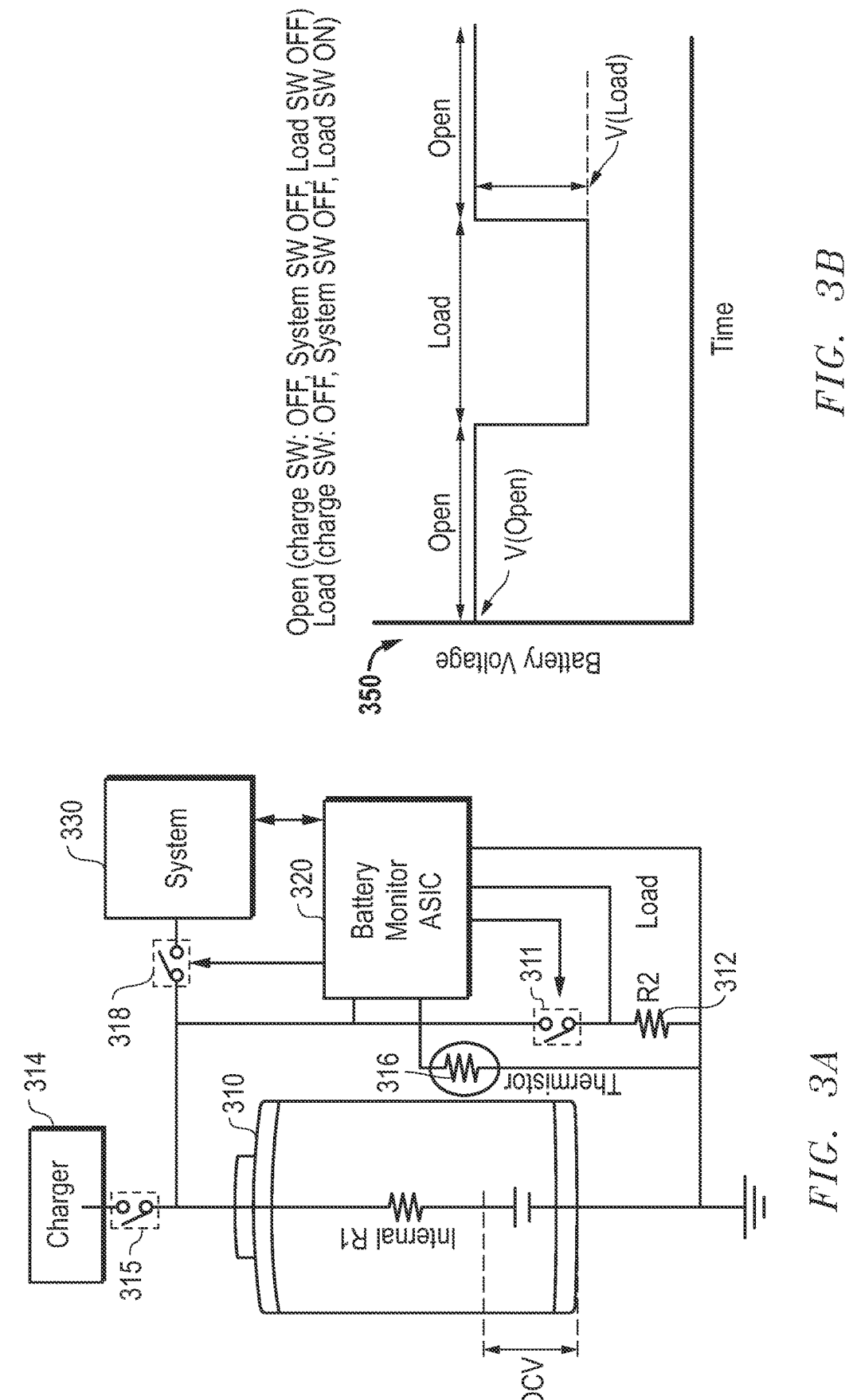
FIG. 3A illustrates in partial block diagram and partial schematic form a system including a battery monitor according to some embodiments.
FIG. 3B shows a plot of the voltage of a battery during a test.

FIG. 3A illustrates in block diagram form a system 300 including a battery monitor according to some embodiments. System 300 is preferably embodied in a device with a fixed electrical supply to provide a failover backup battery, such as a redundant array of inexpensive disks (RAID) storage controller. System 300, in this implementation, generally includes a battery 310, a load control switch 311, a load resistor 312 (labeled "R2"), a charger 314, a charger switch 315, a thermistor 316, a battery power switch 318, a battery monitor application-specific integrated circuit (ASIC) 320, and an application system 330.

Battery 310 is a lithium battery such as a lithium-ion or lithium-polymer battery in this implementation, but batteries of other types may also be used. Battery 310 is shown an ideal voltage source in series with an internal resistance R1, and includes a positive terminal connected to a positive voltage supply rail and a negative terminal connected to a negative voltage supply rail. Thermistor 316 or other temperature sensor is thermally coupled to battery 310 for monitoring its temperature. Charger 314 includes a positive terminal connected to the positive voltage supply rail and a negative terminal connected to the negative voltage supply rail. Further, in some embodiments a separate battery protection IC may be included in the battery module which operates to disconnect the battery from the circuit in the event of thermal runaway.

In this embodiment, load resistor 312 operates as a current load circuit, but in other embodiments the current load circuit may be used which puts a constant current load battery 310.

Battery monitor ASIC 320 includes a first input connected to the positive terminal of battery 310, a second input connected to the negative terminal of battery 310, a third input connected to a positive terminal of load resistor 312, a fourth input connected to an output of thermistor 316, a first output connected to load control switch 311, a second output connected to battery power switch 318, and a bidirectional connection to application system 330. While in this embodiment, charger 314 and battery monitor ASIC 320 are separate circuit modules, in some embodiments they may be integrated into a single battery controller integrated circuit (IC).

Application system 330 generally includes a microcontroller and interface elements along with their supporting electronic components and sensors. The particular components included in application system 330 are different for different applications. For example, in one embodiment in which application system 330 is a RAID controller including a volatile memory such as a DRAM or SRAM acting as a cache for handling data written and read to a plurality of non-volatile memory storage devices such as hard drives or flash drives. Application system 330 includes a positive power supply terminal or "rail" connected to the positive voltage supply rail terminal of battery 310, a negative power supply terminal connected to the negative terminal of battery 310, a bidirectional connection to battery monitor ASIC 320, and various other inputs and outputs for implementing the system functionality.

In operation, when application system is operated with its own power supply, battery 310 provides failover backup power. Battery 310 is maintained in a charged state ready to be used as a failover power supply for application system 330 should its main power supply fail. The temperature of battery 310 depends on the environmental and operating conditions associated within system 300, and may vary in a wide range, for example as described below with respect to FIG. 7. Such variations greatly alter the useful life of battery 310. As further described below, battery monitor ASIC 320 monitors the temperature of battery 310 over time using thermistor 316, and stores a temperature over the accumulated time data. Battery monitor ASIC 320 is able to estimate the battery degradation based on the temperature over accumulated time data. Responsive to the battery degradation estimate meeting a designated condition, battery monitor ASIC 320 operates the switches 318 and 311 to electronically switch the battery from operation to the depicted test circuit including load resistor 312 (or more generally, a load current circuit), and measures the internal impedance R1 of battery 310 with the test circuit including load resistor 312 and switch 311. An alert is issued for a battery if the capacity is lower than a threshold. Then, battery 310 is returned to operation in the failover battery backup circuit without significantly interrupting its availability.

In particular, the aging of the battery and its associated increase in internal resistance are difficult to account for in prior systems without removing the failover battery backup system from the circuit for lengthy testing. The hazard monitoring techniques employed in battery monitor ASIC 320, as further described below, are able to better detect battery fault conditions or dangerously aged batteries in advance, in order to avoid a situation where the backup battery is required during a power system failure but does not meet the minimum capacity needed for operating system 330 for the required time.

FIG. 3B shows a graph 350 of the voltage of battery 310 during a test. The vertical axis shows the battery voltage, and the horizontal axis shows time. As seen in the labels, the test is initiated by first turning off switches 315 and 318, referred to as "charge SW" and "system SW" to provide an open circuit battery voltage, which is measured by battery monitor ASIC 320. Then switch 311, referred to as "load SW" is temporarily turned on to apply load resistor R2 as a load to battery 310. The load is maintained for a short period of time such as 5 seconds, 10 seconds, or 20 seconds, and then the system is returned to the open circuit configuration and then back to the failover backup operation (assuming the battery capacity is not insufficient). Preferably, the entire depicted testing process takes on the order of 50-60 s.

Figure 4:
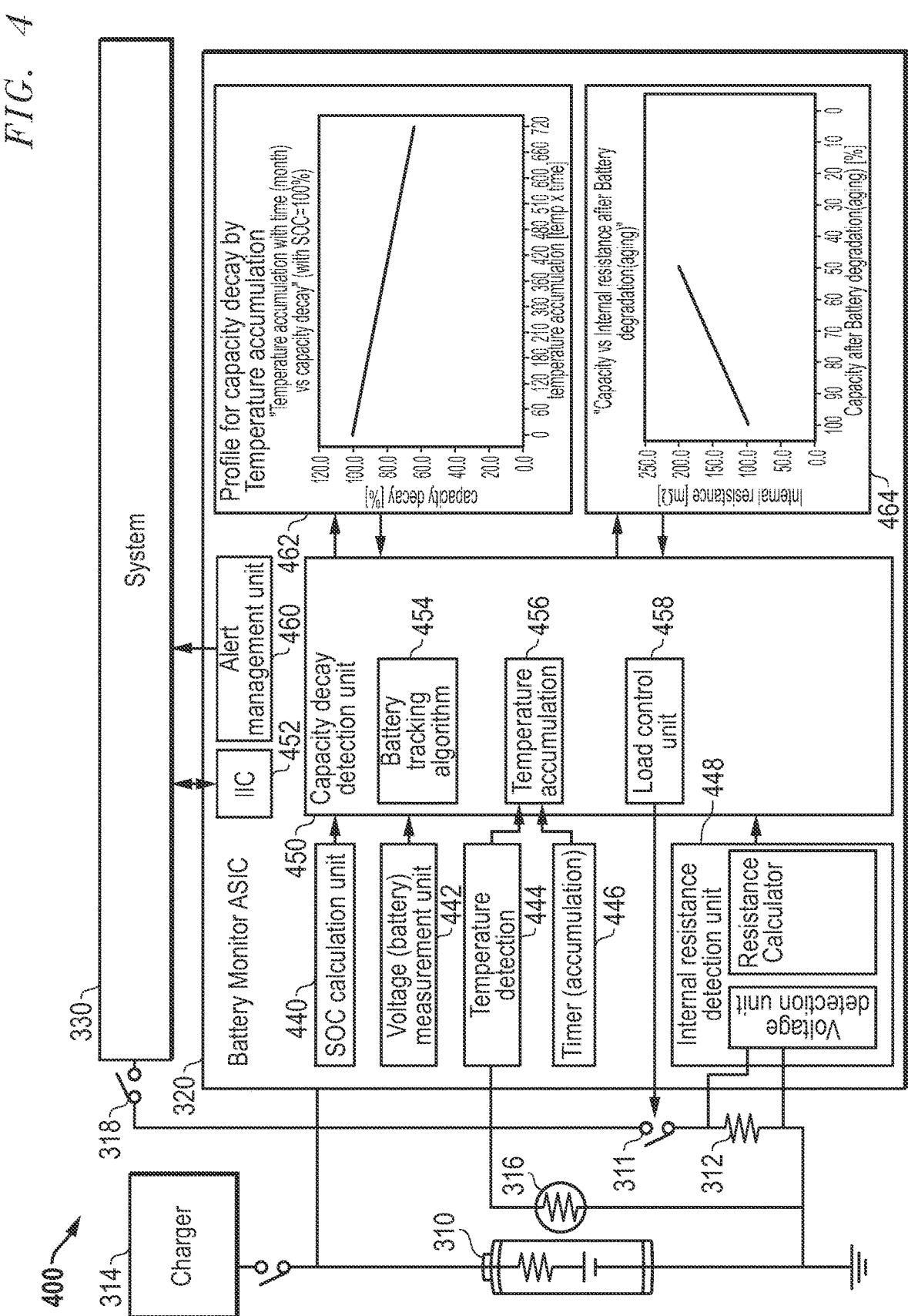
FIG. 4 illustrates in block diagram form a system showing more detail of the battery monitor ASIC of FIG. 3A.

FIG. 4 illustrates in block diagram form a system 400 showing more detail of the battery monitor ASIC 320 of FIG. 3. System 400, in this implementation, generally includes battery 310, load control switch 311, load resistor 312, charger 314, charger switch 315, thermistor 316, battery power switch 318, battery monitor application-specific integrated circuit (ASIC) 320, and application system 330, generally arranged as in FIG. 3A.

Battery monitor ASIC 320, in this implementation, includes a state-of-charge (SOC) calculation unit 440, a battery voltage measurement unit 442, a temperature detection unit 444, an accumulation timer 446, a control unit 450, an Inter-Integrated Circuit (IIC or I²C) bus interface 452, an alert management unit 460, and a memory holding a battery degradation profile data set 462 and a capacity versus internal resistance data set 464. Generally, battery monitor ASIC 320 is implemented with a mix of analog and digital circuitry, flash memory, processor cores, and static random-access memory (SRAM). While an ASIC is used in this embodiment, other implementations may use a programmable logic device, a custom IC, or another suitable integrated circuit or combination of circuits.

State-of-charge (SOC) calculation unit 440 contains digital circuitry which calculates a current SOC for the battery based on the battery voltage and capacity of the battery, which varies over time. The current SOC is employed to maintain the battery at a fully charged state for its current capacity, and for control during activation of the battery backup system. Battery voltage measurement unit 442 receives the voltage on the positive battery terminal and converts it to a digital value for use in battery monitor ASIC 320. Temperature detection unit 444 receives a signal from a temperature sensor for battery 310, in this embodiment thermistor 316, and converts the signal to a digital temperature value to indicate the current battery temperature.

Control unit 450 is generally coupled to the other depicted circuit blocks and includes an interface to a volatile random-access memory (RAM) and a non-volatile memory such as a FLASH memory, which are not separately shown but may be implemented on-chip or off-chip. Control unit 450 generally controls the timing of operation for the other circuit blocks and executes instructions for performing the battery test process as described herein, as well as other battery management processes such as controlling the failover battery backup process, which are not depicted because they are not relevant to the present disclosure. Control unit 450 in this embodiment is a processor core with input/output circuitry for interfacing with the various depicted components. While a processor core is used in this embodiment, other embodiments may instead employ digital logic, for example programmable logic configured with a hardware description language (HDL) such as VHDL. Control unit 450 executes a battery tracking algorithm 454 and a temperature accumulation process 456, typically by executing processor instructions as further described below. Battery tracking algorithm 454 and temperature accumulation process 456 are typically implemented with executable instructions held in non-volatile memory and loaded to volatile memory for execution. In other embodiments, battery tracking algorithm 454 and temperature accumulation process 456 may be accomplished with digital logic circuits or programmable logic circuits. Load control unit 458 generates a signal to control the application of load resistor 312 to battery 310 during battery tests, as further described below, and has an output connected to the control load control switch 311 for applying and removing load resistor 312. Load control unit 458 may be implemented as a control circuit or a control algorithm, in embodiments for which control unit 450 is implemented with a processor.

IIC bus interface 452 is provided for connecting with application 330. IIC bus interface 452 is used to load and update software to battery monitor ASIC 320, and load and update the data sets 462 and 464 for specific battery types installed in the system, as well as for reporting hazard conditions back to application system 330. Alert management unit 460 generates an alert based on the results of the battery testing by battery tracking algorithm 454 to indicate that battery 310 does not have sufficient capacity to function in its failover backup role. The alert is transmitted to application system 330 and is generally intended to cause a user interface, which may be local or remote, to prompt the system operator to replace battery 310.

Battery degradation profile data set 462 battery degradation profile for a battery including first data associating operating temperature over accumulated time with second battery degradation data, and is generally accessed by battery tracking algorithm 454 over time to prepare data associated with the operating temperature over accumulated time. This data is stored to track and estimate battery 310's capacity as further described below. Capacity versus internal resistance data set 464 contains data associating the internal resistance of battery 310 with an actual capacity. Data sets 462 and 464 are stored in non-volatile memory and may be loaded to volatile memory for operation, or accessed directly from the non-volatile memory.

While this particular hardware design is given as an example, it should be apparent after appreciating this description that various other implementations can use different hardware to achieve the battery monitoring functionality discussed below. For example, a purely microcontroller-based implementation may be used in which a controller performs all the functions discussed after measurements are digitized and fed to the controller. Further, as discussed above, in some implementations, programmable logic may be employed using a HDL.

In operation, control unit 450 controls battery monitor ASIC 320 to perform a battery test process, as further described below, to detect a low capacity condition in battery 310.

FIG. 5 shows a flowchart 500 of a process for tracking a battery capacity according to some embodiments. The process represents one example of a battery tracking algorithm in the battery monitor ASIC of FIG. 4, but may be performed by other suitable battery monitoring circuits for monitoring a battery capacity for operation in a failover battery backup system.

The process begins at block 502 where a new battery for operation in the battery backup system. Typically, this step includes providing a battery degradation profile for a battery including first data associating operating temperature over accumulated time with second battery degradation data (for example, data set 462). At block 504, the process charges the battery to a fully charged state, and the charger maintains the battery in the charged state for operation in the failover backup circuit. The full charge level voltage is generally determined by battery specification and charger IC support this full charge level voltage (the high side voltage of the battery with 100% SOC).

At block 506, during operation of the battery backup system, which makes the battery is available as a failover battery backup, the process includes measuring an operating temperature of the battery over time and storing third data associated with the operating temperature over accumulated time. Preferably, this third data is produced using periodically measured temperature data. The temperature measurements are available at sample intervals of well under one second because of safety monitoring, but are generally averaged or sampled for a longer period such as an hour or a day for tracking the operating temperature of the battery over time. Then this measurement is then averaged over a longer period such as a week or a month to be used for tracking the long term capacity decay of the battery as it is used at block 506.

At block 508, during operation, the process includes accessing the battery degradation profile (for example, data set 464) based on the operating temperature over accumulated time data, the stored third data to obtain an associated battery degradation estimate. The battery degradation estimate is typically calculated from the third data including multiple accumulated periods of time at respective multiple temperatures, as exemplified by "case-1" shown in FIG. 7.

At block 510, responsive to the battery degradation estimate meeting a designated low capacity condition, the process goes to block 512 electronically switching the battery from operation to a test circuit, and performing an internal resistance check of the battery to measure the internal impedance or resistance with the test circuit. At block 510, if the estimate does not meet a low capacity condition, the process returns to block 504 where it continues operation.

It is noted that while blocks 504-510 are shown in order, this is not limiting and the various operations may be performed in parallel or in an interrupt-driven arrangement in some embodiments.

FIG. 6 shows a flowchart of a process for performing an internal resistance check of a battery according to some embodiments. The process is suitable for performance under control of the battery tracking algorithm in the battery monitor ASIC of FIG. 4, or other suitable battery monitoring circuits, for monitoring a battery for suitable capacity for operation in a failover battery backup system.

The process begins a battery internal resistance check at block 602. Typically, the process is entered at block 512 of FIG. 5, or from a similar monitoring process which determines an internal resistance check should be made for a backup battery in a failover battery backup system. At block 604, the process turns off the charge switch (for example, 315, FIG. 3), turns off the system switch (i.e., battery power switch 318) to disconnect the backup battery from the backup power system, and then measures the battery open circuit voltage (OCV).

At block 606, the process turns on the load control switch (311), thereby applying the load resistor to the battery for a short period. While the load is applied and after the battery voltage has had time to settle, the process measures the voltage across the load resistor R2 (for example, load resistor 312). Preferably the backup system is returned to operation following the internal resistance measurement to minimize the downtime of the failover battery backup system.

At block 608, the process calculates the battery's internal resistance R1 as being R1=R2×(OCV/VLOAD−1). Based on this calculated R1 value, the process at block 610 checks the battery degradation data (for example, data set 464) for the actual capacity of the battery based on the internal resistance R1. In embodiments using a constant current load rather than a load resistor, the measurement at block 608 is R1=(OCV−VCL (the voltage across the constant current load)/ICL (the current through the constant current load).

At block 612, the process checks if the actual capacity of the battery based on the internal resistance R1 is below an acceptable level. Responsive to an unacceptable value of the internal impedance, the process goes to block 613 where it issues an alert to change the battery. Such an alert is transmitted to the host system 330 by alert management unit 460 in the embodiment of FIG. 4. If the actual capacity of the battery at block 612 is acceptable, the process goes to block 614 where it updates the operating temperature over accumulated time data with a new value based on the actual capacity decay of the battery. Note that if the actual battery capacity from block 610 matches the estimate (block 508, FIG. 5), then no update is needed.

Figures 7, 8:
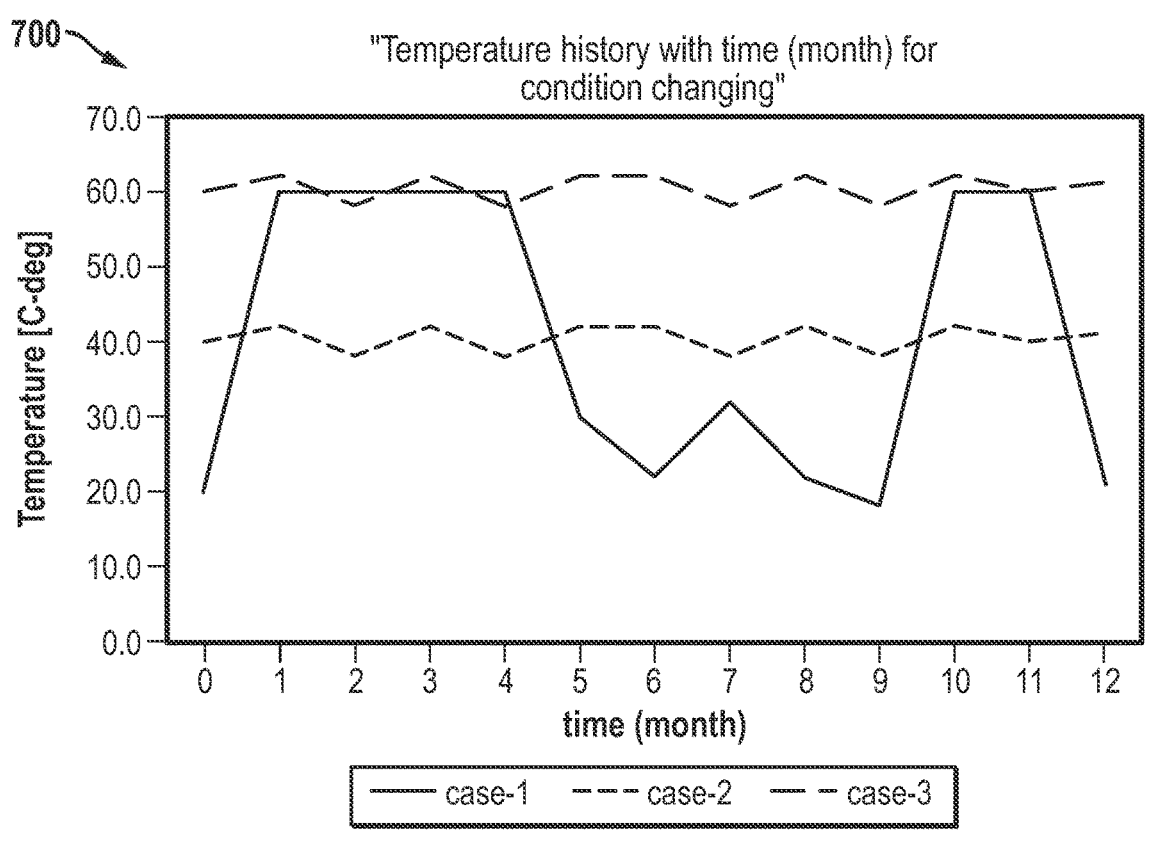
FIG. 7 shows a graph of battery temperature history illustrating three different exemplary cases that may occur in operation of a failover battery backup system.
FIG. 8 shows a table of the data for the same cases.

FIG. 7 shows a chart 700 of battery temperature history illustrating three different exemplary cases that may occur in operation of a failover battery backup system. FIG. 8 shows a table 800 of the data for the same cases. In FIG. 7, the vertical axis shows temperature in degrees Celsius and the horizontal axis shows time in months. As can be seen, in a first example scenario labeled "case-1", the temperature of the battery varies dramatically over time, based on various factors such as the host system load, ambient temperature, climate control availability, and whether the system host is powered on. The battery temperature in case-1 varies from the 20's to 60° C. In the other two cases labeled "case-2" and "case-3", the battery temperature is much more stable, case 2 varying a few degrees around 40° C. and case-3 varies around 60° C.

In table 800, the accumulated temperature over time is shown for month 10 of the historical data, which is highlighted in the "Month" column on the right. As can be seen, while case-1 and case-2 have different histories, their accumulated temperature over time, calculated in this embodiment as temperature×time, is largely the same which will result in a similar estimated battery capacity in block 508 of the process of FIG. 5. Case 3 however, has a much larger accumulated temperature over time, which will result in a much lower battery capacity estimate.

FIG. 9 illustrates in block diagram form a data storage system 900 including a failover battery backup according to some embodiments. Data storage system 900 is merely one example of an embodiment in which the circuits and methods herein may be employed in a failover battery backup system. Other systems such as computing systems or non-volatile dual-inline memory modules (NV-DIMMS) of various types may also employ the circuits and methods herein to monitor a failover battery backup system. Data storage system 900 includes a controller 902 including a DRAM memory 903 which may be employed as a cache for data written to and from a plurality of non-volatile memory drives 904. Power supply 906 is supplied through an electrical connection to power system 900. A failover battery backup system 908 is included to provide backup power should power supply 906 lose power, and includes a battery and circuitry as described above. Failover battery backup system 908 is adapted to use the circuits or methods described above for monitoring the battery, and generally needs to include enough battery capacity to write all data in transit to non-volatile memory drives 904, such as data queued and cached at data storage system 900 for writing to non-volatile memory drives 904. Preferably, data storage system 900 is a RAID system as discussed above, including multiple hard drives, flash drives, or other non-volatile memory storage devices.

Thus, various embodiments of a battery monitor circuit, an apparatus including such a battery monitor, and a corresponding method have been described. The various embodiments provide hazard monitoring for a battery. Known techniques of tracking battery aging and failure can be inaccurate and increase risk of catastrophic failures. Embodiments of the present disclosure improve the monitoring accuracy by monitoring the battery temperature during charge actions, and detecting abnormal temperature ramp-up for designated changes in the battery state-of-charge, comparing the temperature increase against data indicating abnormal battery performance.

The above-disclosed subject matter is to be considered illustrative, and not restrictive, and the appended claims are intended to cover all such modifications, enhancements, and other embodiments that fall within the true scope of the claims. For example, the temperature over accumulated time data may be stored in various forms.

Thus, to the maximum extent allowed by law, the scope of the present invention is to be determined by the broadest permissible interpretation of the following claims and their equivalents, and shall not be restricted by the forgoing detailed description.

The invention claimed is:

1. A method of operating a battery backup system to reduce unavailability, the method comprising:

loading onto a battery monitoring device a predetermined a battery degradation profile for a battery including first data associating operating temperature over accumulated time with second battery degradation data;

under control of the battery monitoring device, operating the battery in a failover battery backup circuit by:

during operation:

a) maintaining the battery in a charged state;

b) measuring an operating temperature of the battery over time and storing third data associated with the operating temperature over accumulated time; and

c) accessing the battery degradation profile based on the third data to obtain a battery degradation estimate; and responsive to the battery degradation estimate meeting a designated condition, electronically switching the battery from operation to a test circuit, measuring an internal impedance of the battery with the test circuit, and returning the battery to operation; and responsive to an unacceptable value of the internal impedance, issuing an alert.

2. The method of claim 1, wherein:

the third data is produced using periodically measured temperature data, and wherein the battery degradation estimate is calculated from the third data including multiple accumulated periods of time at respective multiple temperatures.

3. The method of claim 1, further comprising:

responsive to an acceptable value of the internal impedance, updating a battery degradation estimate based on the internal impedance of the battery.

4. The method of claim 1, wherein:

electronically switching the battery from operation to a test circuit comprises operating a first transistor to remove the battery from a failover backup circuit, measuring an open-circuit voltage of the battery, and operating a second transistor to switch a current load circuit into a circuit with the battery, and measuring the internal impedance of the battery comprises measuring a voltage of the battery across the current load circuit to calculate the internal impedance of the battery.

5. The method of claim 1, wherein:

the battery degradation data includes data associated with battery capacity degradation over a specified time for multiple temperatures.

6. The method of claim 1, wherein:

the battery degradation data includes internal battery resistance.

7. The method of claim 1, wherein:

the method is performed on an application-specific integrated circuit (ASIC) located in a host memory system including the battery.

8. An integrated circuit (IC) for monitoring a failover battery backup system, comprising:

a first input for receiving temperature signal associated with a battery temperature;

a second input receiving a battery voltage;

a non-volatile memory including a predetermined battery degradation profile for a battery including first data associating operating temperature over accumulated time with second battery degradation data; and a hazard detection circuit operable to monitor the battery while it is maintained in the failover battery backup system in a charged state by:

measuring an operating temperature of the battery over time and storing third data associated with the operating temperature over accumulated time;

accessing the battery degradation profile based on the third data to obtain a battery degradation estimate;

responsive to the battery degradation estimate meeting a designated condition, electronically switching the battery from operation to a test circuit, measuring an internal impedance of the battery with the test circuit, and returning the battery to operation; and responsive to an unacceptable value of the internal impedance, issuing an alert.

10

9. The IC of claim 8, wherein:

the third data is produced using periodically measured temperature data, and wherein the battery degradation estimate is calculated from the third data including multiple accumulated periods of time at respective multiple temperatures.

10. The IC of claim 8, wherein the hazard detection circuit is further operable for:

responsive to an acceptable value of the internal impedance, updating a battery degradation estimate based on the internal impedance of the battery.

11. The IC of claim 8, wherein:

electronically switching the battery from operation to a test circuit comprises operating a first transistor to remove the battery from a failover backup circuit, measuring an open-circuit voltage of the battery, and operating a second transistor to switch a current load circuit into a circuit with the battery, and measuring the internal impedance of the battery comprises measuring a voltage of the battery across the current load circuit to calculate the internal impedance of the battery.

12. The IC of claim 8, wherein:

the battery degradation data includes data associated with battery capacity degradation over a specified time for multiple temperatures.

13. The IC of claim 8, wherein:

the battery degradation data includes internal battery resistance.

14. An apparatus comprising:

a memory device including a power supply, non-volatile memory powered by the power supply, a volatile memory powered by the power supply; and a battery backup system for the power supply comprising a battery, a charger coupled to the battery, and a battery monitor circuit including a first temperature sensor thermally coupled to the battery for providing a battery temperature, a voltage monitor for measuring a battery voltage, a non-volatile local memory holding a predetermined battery degradation profile for a battery including first data associating operating temperature over accumulated time with second battery degradation data, and a hazard detection circuit, wherein the hazard detection circuit is operable monitor the battery while it is maintained in the battery backup system in a charged state by:

measuring an operating temperature of the battery over time and storing third data associated with the operating temperature over accumulated time;

accessing the battery degradation profile based on the third data to obtain a battery degradation estimate;

responsive to the battery degradation estimate meeting a designated condition, electronically switching the battery from operation to a test circuit, measuring an internal impedance of the battery with the test circuit, and returning the battery to operation; and responsive to an unacceptable value of the internal impedance, issuing an alert.

15. The apparatus of claim 14, wherein:

the third data is produced using periodically measured temperature data, and wherein the battery degradation estimate is calculated from the third data including multiple accumulated periods of time at respective multiple temperatures.

16. The apparatus of claim 14, wherein the hazard detection circuit is further operable for:

responsive to an acceptable value of the internal impedance, updating a battery degradation estimate based on the internal impedance of the battery.

17. The apparatus of claim 14, wherein:

electronically switching the battery from operation to a test circuit comprises operating a first transistor to remove the battery from a failover backup circuit, measuring an open-circuit voltage of the battery, and operating a second transistor to switch a current load circuit into a circuit with the battery, and measuring the internal impedance of the battery comprises measuring a voltage of the battery across the current load circuit to calculate the internal impedance of the battery.

18. The apparatus of claim 14, wherein:

the battery degradation data includes data associated with battery capacity degradation over a specified time for multiple temperatures.

19. The apparatus of claim 14, wherein:

the battery degradation data includes internal battery resistance.

20. The apparatus of claim 19, wherein:

the hazard detection circuit is embodied in an application-specific integrated circuit (ASIC).

\* \* \* \* \*